(12) United States Patent
Frutschy

(10) Patent No.: US 7,131,850 B2
(45) Date of Patent: Nov. 7, 2006

(54) SOCKET FOR A MICROELECTRONIC COMPONENT HAVING REDUCED ELECTRICAL RESISTANCE AND INDUCTANCE

(75) Inventor: Kristopher J. Frutschy, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/630,583

(22) Filed: Jul. 29, 2003

(65) Prior Publication Data

US 2005/0026465 A1 Feb. 3, 2005

(51) Int. Cl.
*H01R 12/00* (2006.01)

(52) U.S. Cl. .......................... 439/71; 439/66

(58) Field of Classification Search ................ 439/66, 439/71, 74, 92, 108, 109
See application file for complete search history.

(56) References Cited

U.S. PATENT DOCUMENTS

| | | | | |
|---|---|---|---|---|
| 3,927,925 A | * | 12/1975 | Borsuk | ................. 439/109 |
| 4,961,709 A | * | 10/1990 | Noschese | ..................... 439/66 |
| 5,102,352 A | * | 4/1992 | Arisaka | ..................... 439/608 |
| 5,213,521 A | * | 5/1993 | Arisaka | ..................... 439/608 |
| 5,538,433 A | | 7/1996 | Arisaka et al. | |
| 5,702,255 A | * | 12/1997 | Murphy et al. | ............... 439/71 |
| 2002/0115313 A1 | | 8/2002 | Chung et al. | |
| 2002/0195271 A1 | | 12/2002 | Gailus | |

* cited by examiner

*Primary Examiner*—Thanh-Tam Le
(74) *Attorney, Agent, or Firm*—Blakely, Sokoloff, Taylor & Zafman LLP

(57) ABSTRACT

A socket for a microelectronic component is provided. The socket has a base with metal power and ground layers, and further includes a plurality of electrically conductive socket members, some of which are connected in parallel to the metal power layer, others being connected in parallel to the metal ground layer, while others are insulated from both the metal power and ground layers for purposes of providing signals. Each electrically conductive socket member has a protrusion that breaks through an inner insulating layer that defines an opening into which the electrically conductive socket member is inserted. The protrusions are at different heights, so that some of the protrusions make contact with the metal power layer, while others are connected to the metal ground layer or to a dielectric core layer.

10 Claims, 5 Drawing Sheets

SOCKET FOR A MICROELECTRONIC COMPONENT HAVING REDUCED ELECTRICAL RESISTANCE AND INDUCTANCE

BACKGROUND OF THE INVENTION

1). Field of the Invention

This invention relates to a socket for a microelectronic component.

2). Discussion of Related Art

Integrated circuits are usually manufactured in and on semiconductor wafers that are subsequently singulated into individual dies. Such a die is usually mounted on a package substrate for purposes of rigidity and to provide signals, power, and ground to an integrated circuit of the die. Lands on an opposing side of the package substrate are positioned on contacts of a socket that is mounted to a printed circuit board carrier substrate, so as to connect the package substrate electrically to the socket and the carrier substrate.

The socket usually has a base with a plurality of openings therein. Electrically conductive socket members are inserted in the openings and, in addition to the contacts that are against the lands on the package substrate, also have terminals on an opposing side of the base for purposes of connecting to the carrier substrate.

The electrically conductive socket members can provide signals, power, or ground to the integrated circuit. When power is, for example, required at one of the lands on the package substrate, all the power has to be provided through the terminal of the electrically conductive socket member having the contact against the land that requires power. The power required at the land is often extremely high and may vary significantly, thus requiring large, abruptly changing power to be provided to the terminal on an opposing side of the base, leading to high resistance and inductance.

BRIEF DESCRIPTION OF THE DRAWINGS

The invention is described by way of example with reference to the accompanying drawings, wherein.

DETAILED DESCRIPTION OF THE INVENTION

A socket for a microelectronic component is provided. The socket has a base with metal power and ground layers, and further includes a plurality of electrically conductive socket members, some of which are connected in parallel to the metal power layer, others being connected in parallel to the metal ground layer, while others are insulated from both the metal power and ground layers for purposes of providing signals. Each electrically conductive socket member has a protrusion that breaks through an inner insulating layer that defines an opening into which the electrically conductive socket member is inserted. The protrusions are at different heights, so that some of the protrusions make contact with the metal power layer, while others are connected to the metal ground layer or to a dielectric core layer.

Figure 1:
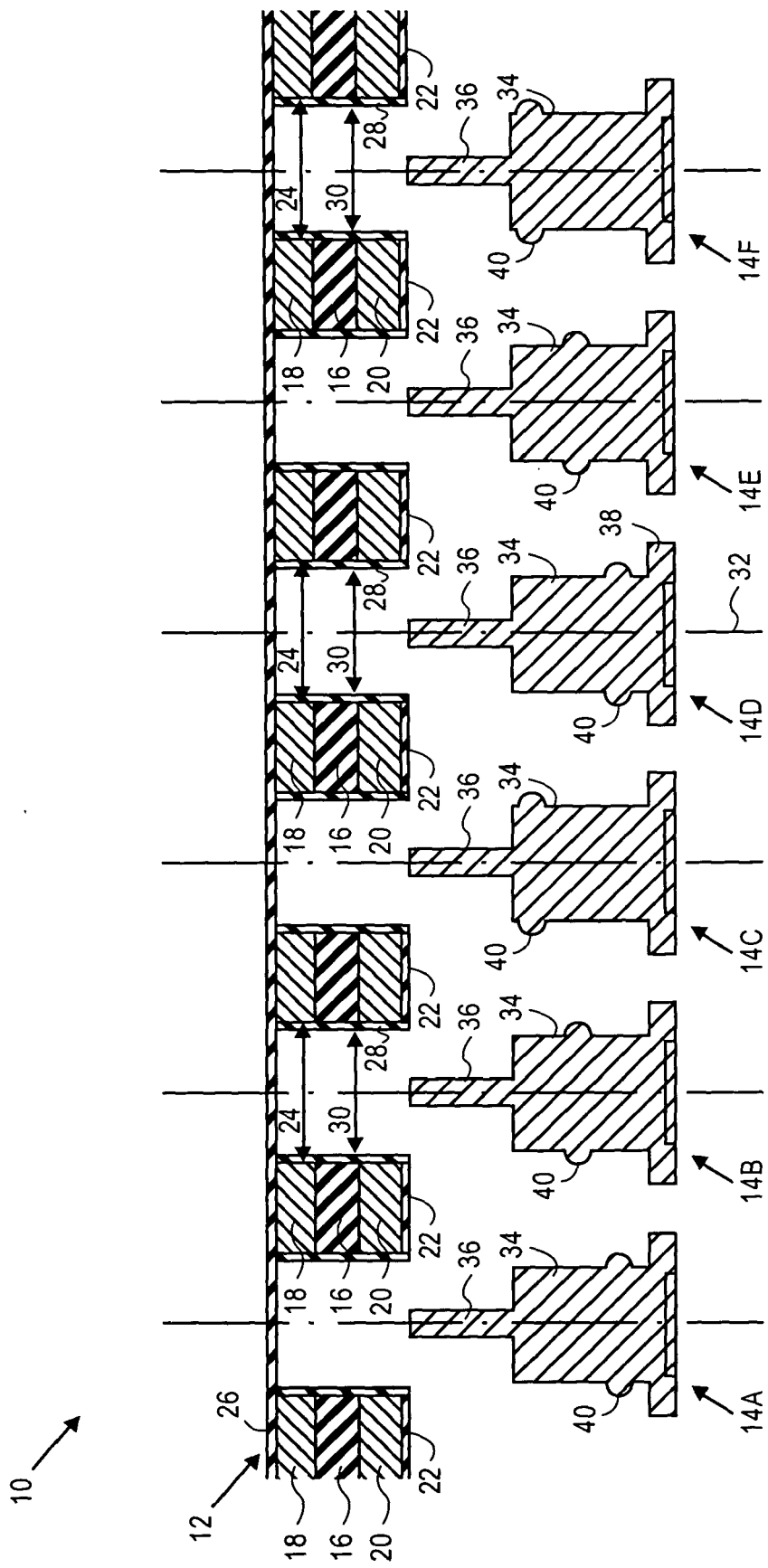
FIG. 1 is a cross-sectional side view illustrating electrically conductive socket members and a portion of a base of a socket, according to an embodiment of the invention.

FIG. 1 of the accompanying drawings illustrates a portion of a socket 10, according to an embodiment of the invention, which includes a base 12 shown in a horizontal orientation and a plurality of spaced electrically conductive socket members 14.

The base 12 includes a dielectric core layer 16 with metal power and ground layers 18 and 20 formed on upper and lower surfaces of the dielectric core layer 16, respectively. The base 12 also includes a lower insulating layer 22 formed on a lower surface of the metal ground layer 20.

A plurality of circular openings 24 are formed at spaced locations in an array in the layers 16, 18, 20, and 22. An upper insulating layer 26 is then formed on an upper surface of the metal power layer 18 and covers the circular openings 24. An inner insulating layer 28 is subsequently formed on surfaces of each opening 24. Inner surfaces of the inner insulating layer 28 form a plurality of circular openings 30.

The electrically conductive socket members 14 all have circular dimensions that are symmetrical about respective central axes 32. Each electrically conductive socket member 14 includes a respective interconnection element 34, a respective spring element 36 at the top of the respective interconnection element 34, and a respective flange stop 38 at the bottom of the respective interconnection element 34. The spring element 36, interconnection element 34, and flange stop 38 have diameters that are progressively larger. The diameter of the interconnection element 34 is slightly smaller, and the diameter of the flange stop 38 is slightly larger than a diameter of one of the openings 30.

Each electrically conductive socket member 14 further has a respective protrusion 40. The protrusion 40 is formed on a respective interconnection element 34, and has an outer diameter that is slightly larger than a diameter of one of the openings 24. The protrusions 40 of the electrically conductive socket members 14A, 14B, and 14C are progressively higher on their respective interconnection elements 34, and the protrusions 40 of the electrically conductive socket members 14D, 14E, and 14F are at the same heights on their respective interconnection elements 34 as the protrusions 40 of the electrically conductive socket members 14A, 14B, and 14C, respectively. The electrically conductive socket members 14 are identical except for the positioning of the protrusions thereon.

Figure 2:
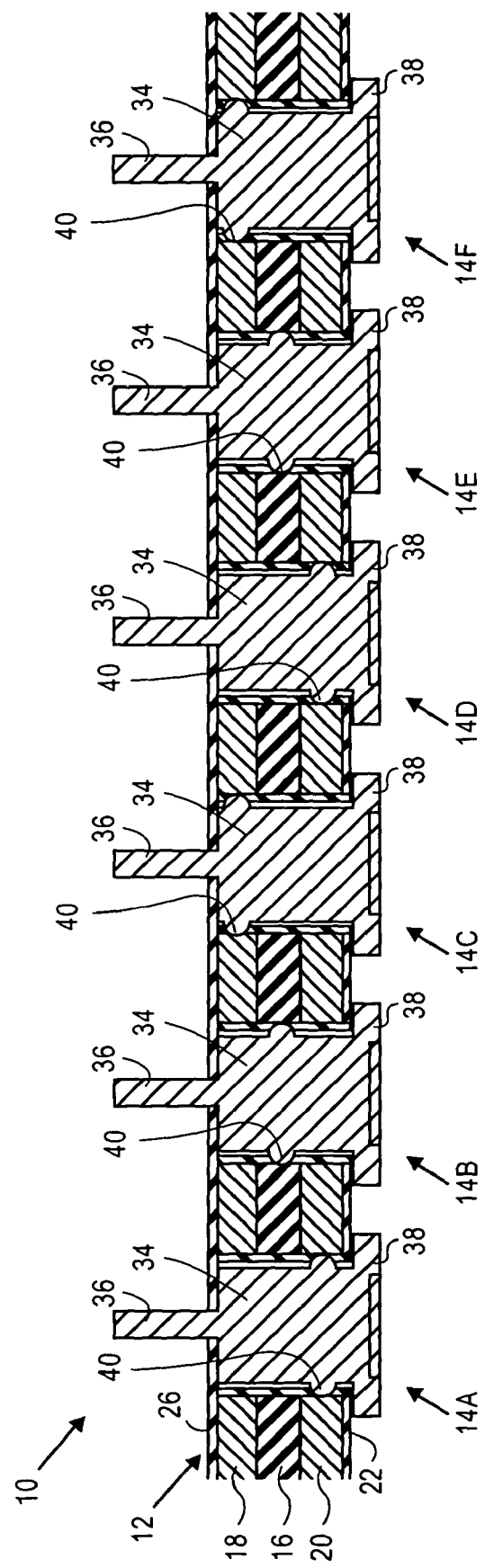
FIG. 2 is a view similar to FIG. 1 after the electrically conductive socket members are inserted into openings in the base.

As illustrated in FIG. 2, the electrically conductive socket members 14 are subsequently inserted into the openings 30 in the base 12. The spring element 36 of the respective electrically conductive socket member 14 is inserted first and pierces through the upper insulating layer 26. The interconnection element 34 of the respective electrically conductive socket member 14 follows the spring element 36. Movement of the interconnection element 34 is stopped when the flange stop 38 contacts a lower surface of the lower insulating layer 22.

The protrusions 40, being slightly larger than the openings 24, break through the inner insulating layer 28. The flange stops 38 determine how far the protrusions 40 are inserted and with which layers 16, 18, or 20, which are at different elevations, they are aligned. The protrusions 40 of the electrically conductive socket members 14A and 14D are in contact with the same metal ground layer 20, whereas the protrusions 40 of the electrically conductive socket members 14C and 14F are in contact with the same metal power layer 18. The electrically conductive socket members 14A and 14D are thus grounded, whereas the electrically conductive socket members 14C and 14F are connected to power. Furthermore, by connecting a set of more than one electrically conductive socket member (e.g., a ground set including electrically conductive socket members 14A and 14D) to the same metal layer (e.g., 20) the same metal layer is used to conduct current to or from more than one electrically conductive socket member. Electrical resistance and inductance are reduced for the entire socket and the power delivery system that the socket forms part of. Electrical resistance and inductance are reduced by the socket's ability to share current among all of the power and ground terminals. Sharing of current reduces a voltage drop across the socket, hence reducing a voltage drop seen by a component held by the socket. The protrusions 40 of the electrically conductive socket members 14B and 14E are in contact with only the dielectric core layer 16. The electrically conductive socket members 14B and 14E can be used for transmitting signals because of their electric isolation from one another and from the metal power layer 18 and the metal ground layer 20.

Figure 3:
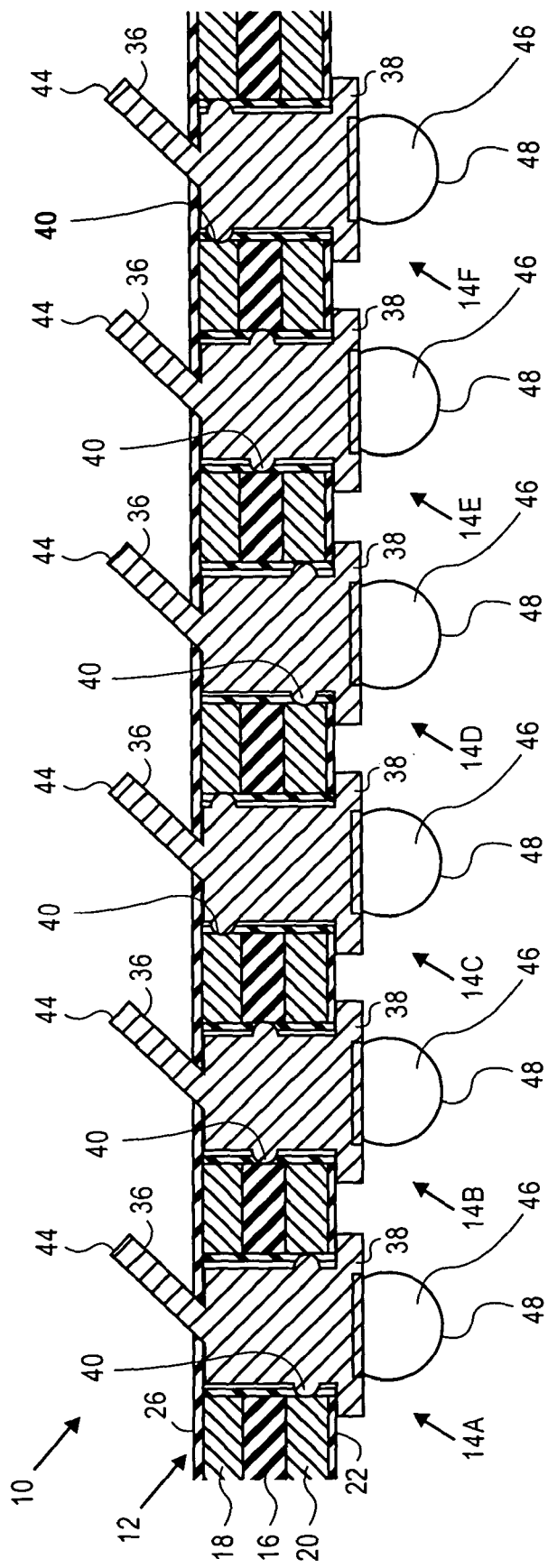
FIG. 3 is a view similar to FIG. 2 after spring elements of the electrically conductive socket members are bent into cantilever orientations and solder balls are attached to the socket members.

As illustrated in FIG. 3, the spring elements 36 are subsequently bent into cantilever positions of approximately 45° relative to horizontal. Each spring element 36 has a respective contact 44 at a tip thereof. The contacts 44 can be used to make contact with corresponding lands of a microelectronic component. Solder balls 46 are attached to lower surfaces of the electrically conductive socket members 14. Lower surfaces of the solder balls 46 form terminals 48 that can be located on corresponding connection pads of a carrier substrate such as a printed circuit board, and then be soldered to the connection lands in a thermal reflow process.

Figure 4:
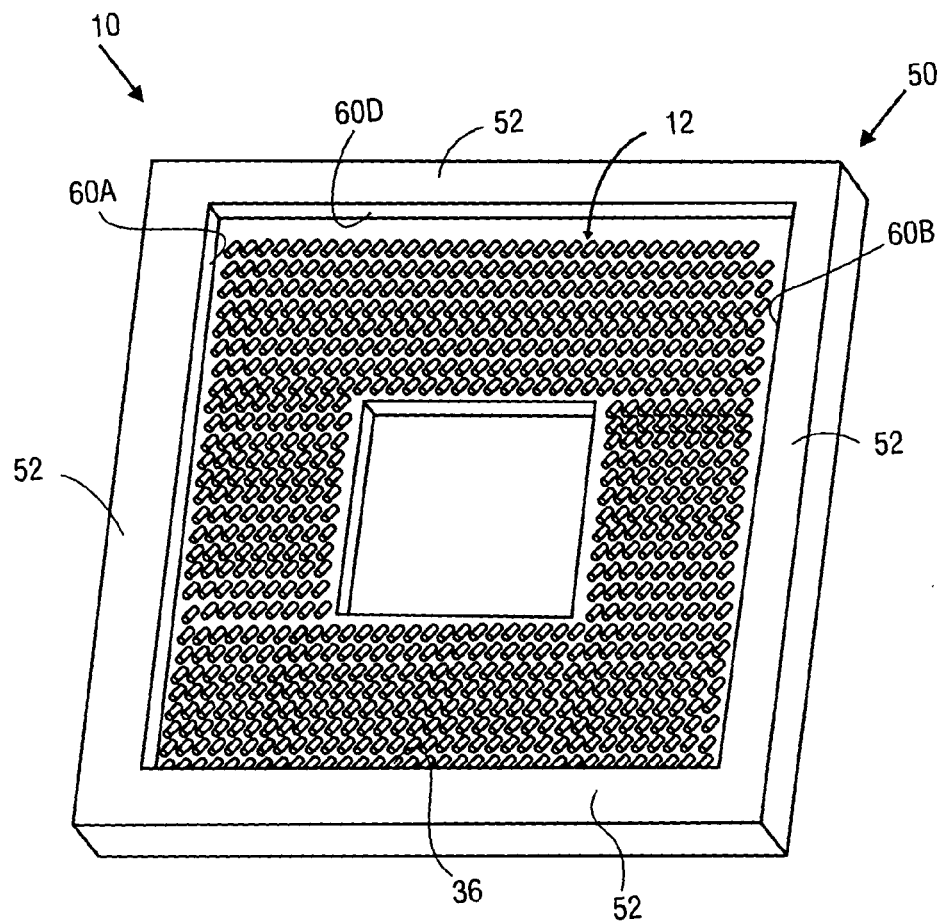
FIG. 4 is a perspective view illustrating the socket.

FIG. 4 illustrates further features of the socket 10. A socket body 50, which includes the base 12, further includes four side walls 52 extending upward from the base 12. The side walls 52 have inner surfaces 60A–D that jointly define a recessed formation for receiving a microelectronic component.

Figure 5:
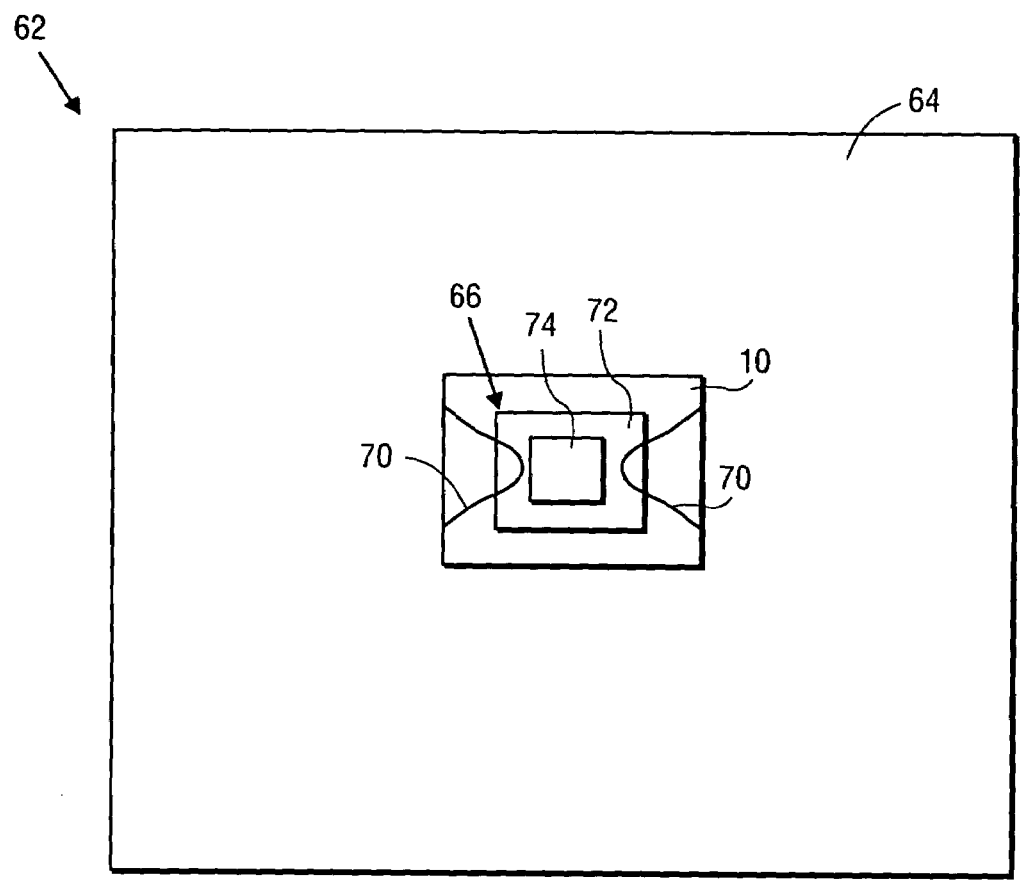
FIG. 5 is a top plan view of an electronic assembly that includes the socket and a microelectronic component held by the socket.
Figure 6:
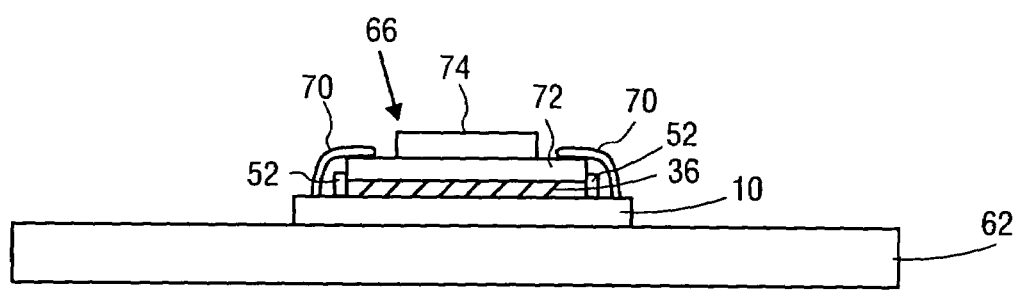
FIG. 6 is a side view of the assembly of FIG. 5.

FIGS. 5 and 6 illustrate an electronic assembly 62 which includes a carrier substrate in the form of a printed circuit board 64, the socket 10 mounted to the printed circuit board 64, a microelectronic component 66 held by the socket 10, and spring dips 70. The microelectronic component 66 includes a package substrate 72 and a microelectronic die, typically a semiconductor microelectronic die 74, mounted to the package substrate 72. The package substrate 72 has a shape that conforms to the shape of the recessed formation defined by the side walls 52. The package substrate 72 is depressed against the spring elements 36 so that the spring elements 36 make good contact with all the lands on the package substrate 72. The spring clips 70 are mounted to the socket body 50 of the socket 10, and are used to retain the microelectronic component 66 in the socket 10 and to provide an equal and opposing force to the force created by the spring elements 36.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A socket for a microelectronic component, comprising:
   a socket body having a formation for receiving the microelectronic component and including at least a power metal portion, a ground metal portion and a dielectric portion;
   a plurality of contacts on the socket body for making contact with corresponding lands of the microelectronic component;
   a plurality of terminals on the socket body for connecting to corresponding connections on a carrier substrate;
   a plurality of interconnection elements in the socket body, each interconnecting a respective contact with a respective terminal; and
   a respective protrusion on each respective interconnection element, the each interconnection element and the respective protrusion being inserted into an opening in the socket body until the protrusion is in contact with either the power metal portion, the ground metal portion, or the dielectric portion, a power set of the interconnection elements electrically connected to the metal power portion, a ground set of the interconnection elements all being electrically connected to the ground metal portion, and a signal set of the interconnection elements each being electrically disconnected from both the power metal portion and the ground metal portion.

2. The socket of claim 1, further comprising a stop component on the interconnection element to limit how far the interconnection element is inserted into the opening and to ensure that the protrusion is in line with the metal portion.

3. The socket of claim 1, wherein the power metal portion is at a different elevation than the ground metal portion, at least some of the interconnection elements each being inserted into a respective opening in the socket body, the protrusions of the power set being in contact with the power metal portion and the protrusions of the ground set being in contact with the ground metal portion.

4. The socket of claim 3, further comprising a stop component on each interconnection element to limit how far the respective interconnection element is inserted into the respective opening, the protrusion of each interconnection element of the power set being at a first distance from the stop component and the protrusion of each interconnection element of the ground set being at a second distance, different to the first distance, from the stop component.

5. The socket of claim 4, wherein protrusions on the interconnection elements of the signal set contact the dielectric portion.

6. The socket of claim 5, further comprising a plurality of solder balls each on a respective one of the interconnection elements, each terminal being on a respective solder ball.

7. The socket of claim 1, further comprising a plurality of spring components on the interconnection element, each contact being on a respective spring component.

8. A socket for a microelectronic component, comprising:
   a socket body having a horizontal base with upper and lower substantially horizontal sides and including at least a power metal portion, a ground metal portion and a dielectric portion, and side walls extending upward from the base, the side walls having inner surfaces jointly defining a recessed formation for receiving the microelectronic component;
   a plurality of electrically conductive contacts on the socket body at the upper horizontal side, spaced from one another for making contact with corresponding spaced lands of the microelectronic component;

a plurality of terminals on the socket body at the lower horizontal side, spaced from one another for connecting to corresponding connections on a carrier substrate;

a plurality of interconnection elements in the socket body, each extending between and interconnecting a respective one of the contacts with a respective one of the terminals; and a respective protrusion on each interconnection element, the each interconnection element and the respective protrusion being inserted into an opening in the socket body until the protrusion is in contact with either the power metal portion, the ground metal portion, or the dielectric portion, a power set of the interconnection elements electrically connected to the metal power portion, a ground set of the interconnection elements all being electrically connected to the ground metal portion, and a signal set of the interconnection elements each being electrically disconnected from both the power metal portion and the ground metal portion.

9. The socket of claim 8, wherein the power metal portion is at a different elevation than the ground metal portion, at least some of the interconnection elements each inserted into a respective opening in the base, further comprising a protrusion on each of the respective interconnection elements, the protrusions of the power set being in contact with the power metal portion and the protrusions of the ground set being in contact with the ground metal portion.

10. The socket of claim 9, further comprising a stop component on each interconnection element to limit how far the respective interconnection element is inserted into the respective opening, the protrusion of each interconnection element of the power set being at a first distance from the stop component and the protrusion of each interconnection element of the ground set being at a second distance, different to the first distance, from the stop component.

* * * * *